(12) United States Patent
Song

(10) Patent No.: US 9,472,276 B1
(45) Date of Patent: Oct. 18, 2016

(54) SEMICONDUCTOR APPARATUS FOR READING STORED INFORMATION OF A RESISTOR OR CELL

(71) Applicant: SK hynix Inc., Gyeonggi-do (KR)

(72) Inventor: Hyun Min Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/843,562

(22) Filed: Sep. 2, 2015

(30) Foreign Application Priority Data

May 8, 2015 (KR) .......................... 10-2015-0064854

(51) Int. Cl.
*G11C 11/00* (2006.01)
*G11C 13/00* (2006.01)

(52) U.S. Cl.
CPC ......... *G11C 13/004* (2013.01); *G11C 13/0004* (2013.01); *G11C 13/0007* (2013.01); *G11C 13/0038* (2013.01); *G11C 13/0069* (2013.01)

(58) Field of Classification Search
CPC ............ G11C 13/004; G11C 13/0038; G11C 13/0069; G11C 13/0004; G11C 13/0007
USPC .......... 365/148, 158, 189.05, 189.11, 230.06
See application file for complete search history.

(56) References Cited

U.S. PATENT DOCUMENTS

| 5,917,348 | A | 6/1999 | Chow | |
|---|---|---|---|---|
| 6,275,429 | B1 * | 8/2001 | Bae | G11C 7/1048 365/203 |
| 6,947,342 | B2 * | 9/2005 | Ishida | G11C 11/419 365/189.09 |
| 7,254,072 | B2 * | 8/2007 | Kuroda | G11C 7/1048 365/203 |
| 9,312,000 | B1 * | 4/2016 | Song | G11C 13/004 |
| 2010/0195377 | A1 * | 8/2010 | Kim | G11C 29/026 365/163 |

* cited by examiner

*Primary Examiner* — Pho M Luu
(74) *Attorney, Agent, or Firm* — IP & T Group LLP

(57) ABSTRACT

A semiconductor apparatus includes a variable resistor, a variable resistor selection unit configured to electrically couple the variable resistor to a sense amplifier in response to a resistor selection signal, a power supply unit configured to apply a first voltage to the variable resistor selection unit in response to a read signal, and a switch driving unit configured to generate the resistor selection signal in response to a resistor selection control signal, and to raise a voltage of the resistor selection signal when the first voltage is applied to the variable resistor selection unit.

19 Claims, 4 Drawing Sheets

US 9,472,276 B1

SEMICONDUCTOR APPARATUS FOR READING STORED INFORMATION OF A RESISTOR OR CELL

CROSS-REFERENCES TO RELATED APPLICATION

The present application claims priority under 35 U.S.C. §119(a) to Korean application number 10-2015-0064854, filed on May 8, 2015 in the Korean Intellectual Property Office, which is incorporated herein by reference in its entirety.

BACKGROUND

1. Technical Field

Various embodiments relate to a semiconductor apparatus, and more particularly, to a semiconductor apparatus for reading information stored in a resistor or a cell.

2. Related Art

Semiconductor apparatuses use transistors in various ways. A transistor includes a gate, a drain and a source. When the gate of the transistor receives a voltage that is higher than its threshold voltage, a channel is created between the drain and source and current flows. Transistors are generally categorized into N channel MOS transistors and P channel MOS transistors. The N channel MOS transistors generally do not transfer higher voltages and the P channel MOS transistors generally do not transfer lower voltages.

Even though transistors are broadly used as switching devices in electronics, each type can only operate well under certain voltage conditions. For example, when the N channel MOS transistor is electrically coupled between a power supply voltage and a ground voltage, the N channel MOS transistors end up transferring the power supply voltage minus the threshold voltage of the N channel MOS transistor. Therefore, the N channel MOS transistor is generally not used as a switching device for transferring information that is voltage or current sensitive. In order for an N channel MOS transistor to transfer higher voltages without voltage drop, the voltage inputted to the gate of the N channel MOS transistor may be raised or a back-bias voltage of the N channel MOS transistor may be changed.

SUMMARY

In an embodiment of the present invention, a semiconductor apparatus may include a variable resistor; a variable resistor selection unit suitable for electrically coupling the variable resistor to a sense amplifier in response to a resistor selection signal; a power supply unit suitable for applying a first voltage to the variable resistor selection unit in response to a read signal; and a switch driving unit suitable for generating the resistor selection signal in response to a resistor selection control signal, and for raising a voltage of the resistor selection signal when the first voltage is applied to the variable resistor selection unit.

In an embodiment of the present invention, a semiconductor apparatus may include a column selection unit suitable for electrically coupling a power supply unit to a memory cell through a bit line in response to a bit line selection signal; the power supply unit suitable for applying a first voltage to the column selection unit in response to a read signal; and a switch driving unit suitable for generating the bit line selection signal in response to a column selection signal, and for raising a voltage level of the bit line selection signal when the first voltage is applied to the column selection unit.

DETAILED DESCRIPTION

Hereinafter, a semiconductor apparatus according to the present invention will be described with reference to the accompanying drawings through exemplary embodiments.

Figure 1:
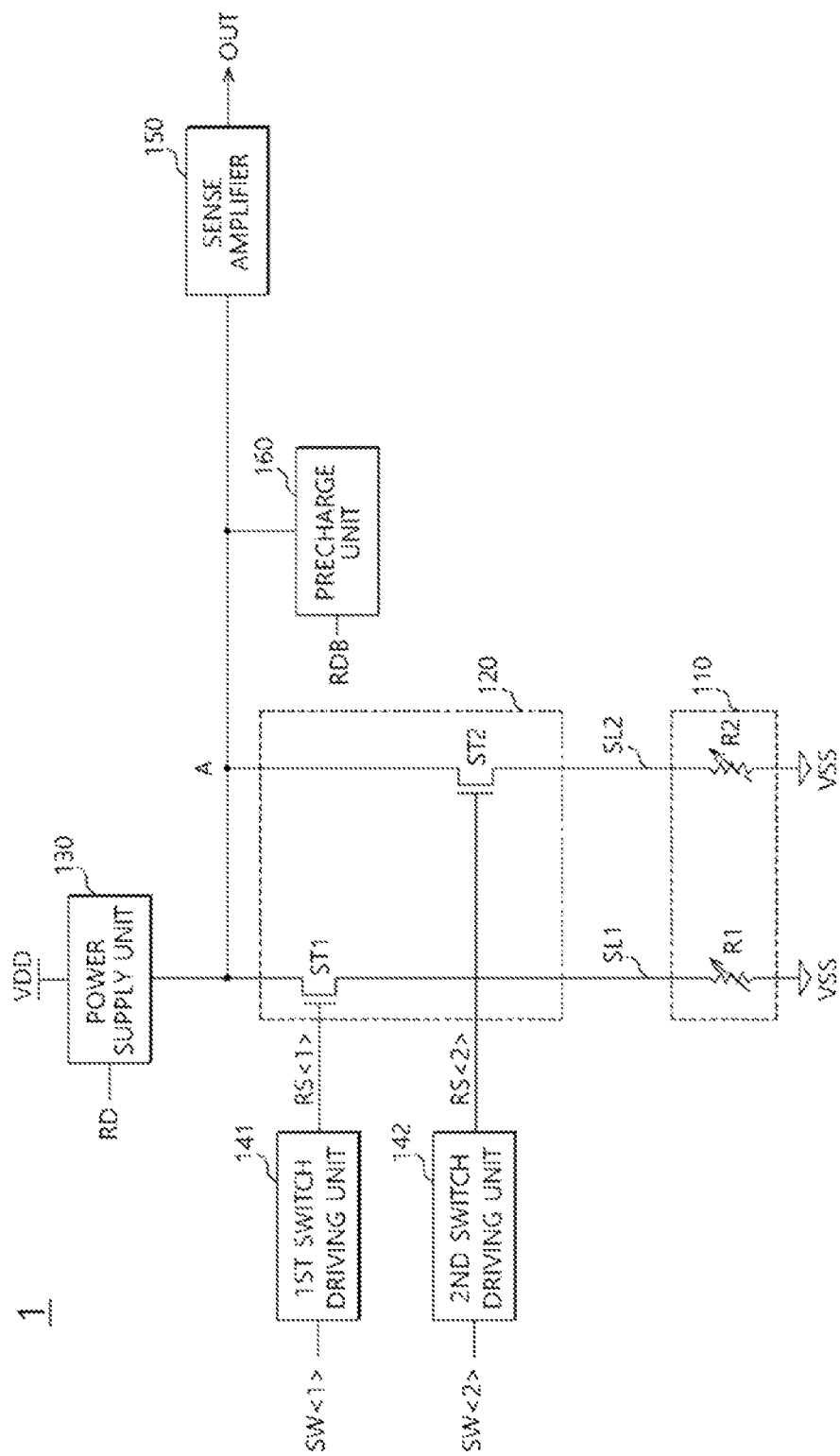
FIG. 1 shows a block diagram illustrating a semiconductor apparatus in accordance with an embodiment of the present invention.

FIG. 1 shows a block diagram illustrating a semiconductor apparatus in accordance with an exemplary embodiment of the present disclosure. Referring to FIG. 1, the semiconductor apparatus 1 may include a variable resistor unit 110, a variable resistor selection unit 120, a power supply unit 130 and a plurality of switch driving units 141 and 142.

The variable resistor unit 110 may include first and second variable resistors R1 and R2. FIG. 1 exemplarily shows the variable resistor unit 110 including two variable resistors. The variable resistor unit 110 may include more variable resistors arranged in an array. Each of the first and second variable resistors R1 and R2 may be electrically coupled to a ground voltage at one end, and to the variable resistor selection unit 120 at the other end. The first variable resistor R1 may be electrically coupled to a first resistor selection line SL1, and the second variable resistor R2 may be electrically coupled to a second resistor selection line SL2.

Each of the first and second variable resistors R1 and R2 may include a variable resistance element. The variable resistance element may have a variable resistance value according to temperature, magnetic field arrangement, and voltage or current conditions. Each of the first and second variable resistors R1 and R2 may have a specific resistance value according to stored information. The resistance values of the first and second variable resistors R1 and R2 may be set by a write circuit for storing the information.

The variable resistor selection unit 120 may select one of the first and second resistor selection lines SL1 and SL2 according to first and second resistor selection signals RS<1:2>. The variable resistor selection unit 120 may be electrically coupled to a common node A. The variable resistor selection unit 120 may be electrically coupled to the power supply unit 130 through the common node A. The variable resistor selection unit 120 may be electrically coupled to the first and second variable resistors R1 and R2 through the first and second resistor selection lines SL1 and SL2, respectively. The variable resistor selection unit 120 may include a plurality of switch transistors ST1 and ST2, a number of which corresponds to a number of the resistor selection lines SL1 and SL2.

The plurality of switch transistors ST1 and ST2 may include the N channel MOS transistor. When each of the plurality of switch transistors ST1 and ST2 is an N channel MOS transistor, there is a voltage drop equal to the threshold voltage of the switch transistors ST1 and ST2 in voltage or current provided from the common node A to the first and second variable resistors R1 and R2 through the plurality of switch transistors ST1 and ST2. Therefore, the voltage or current passing through the plurality of switch transistors ST1 and ST2 needs to be increased at the gates of the plurality of switch transistors ST1 and ST2, which will be described later in detail.

The variable resistor selection unit 120 may include the first and second switch transistors ST1 and ST2. The first switch transistor ST1 may be electrically coupled to the first resistor selection line SL1. The second switch transistor ST2 may be electrically coupled to the second resistor selection line SL2. The first switch transistor ST1 may receive the first resistor selection signal RS<1> at its gate, may be electrically coupled to the common node A at its drain, and may be electrically coupled to the first variable resistor R1 at its source. When the first resistor selection signal RS<1> is enabled, the first switch transistor ST1 may electrically couple the first variable resistor R1 and the common node A. The second switch transistor ST2 may receive the second resistor selection signal RS<2> at its gate, may be electrically coupled to the common node A at its drain, and may be electrically coupled to the second variable resistor R2 at its source. When the second resistor selection signal RS<2> is enabled, the second switch transistor ST2 may electrically couple the second variable resistor R2 and the common node A.

The power supply unit 130 may be electrically coupled to the common node A. The power supply unit 130 may provide a first voltage to the common node A in response to a read signal RD. Therefore, when the read signal RD is enabled, the power supply unit 130 may provide the first voltage to the variable resistor selection unit 120 through the common node A. The read signal RD may be enabled during a read operation, which is a process of reading information stored in the first and second variable resistors R1 and R2. The first voltage may correspond to a power supply voltage VDD of the semiconductor apparatus. When the power supply unit 130 provides the first voltage to the first and second variable resistors R1 and R2 through the common node A and the first and second resistor selection lines SL1 and SL2, variable current may flow and the amount depends on the resistance value of the selected one of the first and second variable resistors R1 and R2, through the common node A. This means that the voltage level of the common node A may change according to the resistance value of the selected variable resistor.

The plurality of switch driving units 141 and 142 may include first and second switch driving units 141 and 142. The first and second switch driving units 141 and 142 may generate the first and second resistor selection signals RS<1:2> in response to first and second resistor selection control signals SW<1:2>, respectively. Each of a number of the switch driving units 141 and 142, a number of the resistor selection control signals SW<1:2>, and a number of the resistor selection signals RS<1:2> may correspond to a number of the resistor selection lines SL1 and SL2. The first and second resistor selection control signals SW<1:2> may be provided for selection of the variable resistors R1 and R2 to be accessed during the read operation. For example, the first resistor selection control signal SW<1> may be enabled for access to the first variable resistor R1. The first switch driving unit 141 may enable the first resistor selection signal RS<1> in response to the first resistor selection control signal SW<1>, and thus the first resistor selection line SL1 may be selected. The second resistor selection control signal SW<2> may be enabled for access to the second variable resistor R2. The second switch driving unit 142 may enable the second resistor selection signal RS<2> in response to the second resistor selection control signal SW<2>, and thus the second resistor selection line SL2 may be selected.

The first switch driving unit 141 may generate the first resistor selection signal RS<1> having a level of a second voltage 14) when the first resistor selection control signal SW<1> is enabled. Also, the first switch driving unit 141 may generate the first resistor selection signal RS<1> having a level of a third voltage when the read signal RD is enabled and the first voltage is provided to the variable resistor selection unit 120. In similar way, the second switch driving unit 142 may generate the second resistor selection signal RS<2> having the level of second voltage when the second resistor selection control signal SW<2> is enabled. Also, the second switch driving unit 142 may generate the second resistor selection signal RS<2> having a third voltage when the read signal RD is enabled and the first voltage is provided to the variable resistor selection unit 120. The level of third voltage may be higher than the level of second voltage, and may correspond to the first and second voltages, which will be described later.

The first and second switch driving units 141 and 142 may respectively increase voltage levels of the first and second resistor selection signals RS<1:2> when the first voltage is provided to the variable resistor selection unit 120. The first and second resistor selection signals RS<1:2> may be inputted to the gates of the first and second switch transistors ST1 and ST2, respectively. Therefore, the first and second switch driving units 141 and 142 may remove or compensate for the loss caused by the threshold voltages of the first and second switch transistors ST1 and ST2 by increasing the voltage of the first and second resistor selection signals RS<1:2>.

Referring to FIG. 1, the semiconductor apparatus 1 may further include a sense amplifier 150 and a precharge unit 160. When one of the first and second resistor selection lines SL1 and SL2 is selected by the first and second resistor selection signals RS<1:2>, the sense amplifier 150 may generate an output signal OUT by sensing and amplifying information stored in one of the first and second variable resistors R1 and R2, which is electrically coupled to the selected one of the first and second resistor selection lines SL1 and SL2. The sense amplifier 150 may be electrically coupled to the common node A. The first and second variable resistors R1 and R2 may be electrically coupled to the sense amplifier 150 through the first and second switch transistors ST1 and ST2. Therefore, the sense amplifier 150 may be electrically coupled to the first and second variable resistors R1 and R2, and may generate the output signal OUT by sensing and amplifying the information of the first and second variable resistors R1 and R2, which is inputted through the first and second resistor selection lines SL1 and SL2. The sense amplifier 150 may include an analogue to digital converter (ADC) suitable for generating digital signals by sensing current flowing through the common node A, or a voltage amplifier suitable for generating digital signals by voltages of the common node A and a reference voltage.

The precharge unit 160 may precharge the common node A in response to an inverse signal RDB of the read signal RD. For example, when the read signal RD is disabled, the precharge unit 160 may precharge the common node A by driving the common node A to the ground voltage. The precharge unit 160 may be turned off and release the precharge of the common node A when the read signal RD is enabled.

Figure 2:
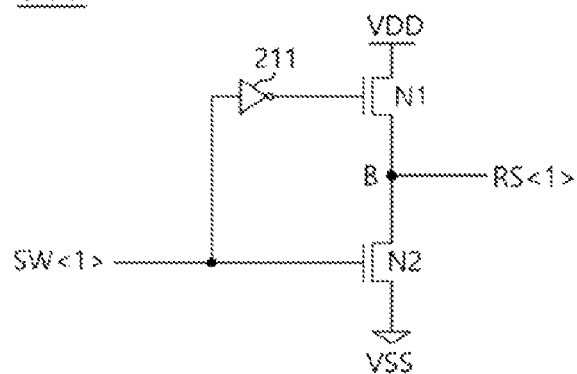
FIG. 2 shows a circuit diagram illustrating a first switch driving unit shown in FIG. 1.

FIG. 2 shows a circuit diagram illustrating the first switch driving unit 141 shown in FIG. 1. Referring to FIG. 2, the first switch driving unit 141 may include an inverter 211, a first transistor N1 and a second transistor N2.

The inverter 211 may invert the first resistor selection control signal SW<1> and output the inverted signal. The first transistor N1 may receive the output of the inverter 211, and drive an output node B to the first voltage. The second transistor N2 may receive the first resistor selection control signal SW<1>, and drive the output node B to the ground voltage VSS. The first resistor selection signal RS<1> may be generated through the output node B. The first and second transistors N1 and N2 may be the N channel MOS transistors. The first transistor N1 may receive the output of the inverter 211 at its gate, may be electrically coupled to the power supply voltage VDD at its drain, and may be electrically coupled to the output node B at its source. The second transistor N2 may receive the first resistor selection control signal SW<1> at its gate, may be electrically coupled to the output node B at its drain, and may be electrically coupled to the ground voltage VSS at its source.

The first switch driving unit 141 may low-disable the first resistor selection signal RS<1> when the first resistor selection control signal SW<1> becomes high-disabled. The first switch driving unit 141 may high-enable the first resistor selection signal RS<1> when the first resistor selection control signal SW<1> becomes low-enabled. The high-enabled first resistor selection signal RS<1> may have the second voltage. When the first resistor selection control signal SW<1> becomes enabled, the first transistor N1 may be turned on and the first voltage may be outputted through the output node B by the first transistor N1. When the first voltage is applied, a loss may occur in the amount of the threshold voltage VthN1 of the first transistor N1. Therefore, the first resistor selection signal RS<1> may have the level 'VDD−VthN1' of the first voltage, i.e., the power supply voltage VDD minus the threshold voltage VthN1 of the first transistor N1. That is, the second voltage may correspond to the level 'VDD−VthN1' of the first voltage VDD minus the threshold voltage VthN1 of the first transistor N1. The second switch driving unit 142 may be the same as the first switch driving unit 141 except for the input and output signals.

Figure 3:
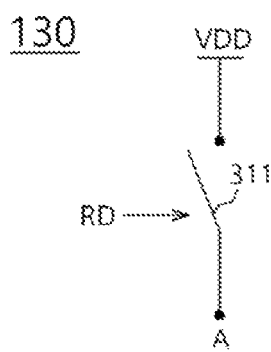
FIG. 3 shows a circuit diagram illustrating a power supply unit shown in FIG. 1.

FIG. 3 shows a circuit diagram illustrating the power supply unit 130 shown in FIG. 1. Referring to FIG. 3, the power supply unit 130 may include a switch 311. The switch 311 may be turned on in response to the read signal RD. When the read signal becomes enabled, the switch 311 may be turned on and the first voltage VDD may be applied to the common node A through the switch 311.

Figure 4:
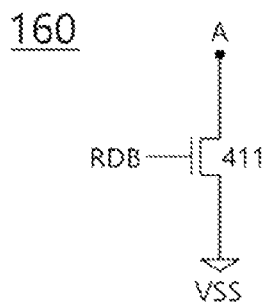
FIG. 4 shows a circuit diagram illustrating a precharge unit shown in FIG. 1.

FIG. 4 shows a circuit diagram illustrating the precharge unit 160 shown in FIG. 1. Referring to FIG. 4, the precharge unit 160 may include a third transistor 411. The third transistor 411 may be an N channel MOS transistor. The third transistor 411 may receive the inversed signal RDB of the read signal RD at its gate, may be electrically coupled to the common node A at its drain, and may be electrically coupled to the ground voltage VSS at its source. The third transistor 411 may drive the common node A to the ground voltage VSS when the read signal RD becomes disabled and the inversed signal RDB becomes enabled.

Figure 5:
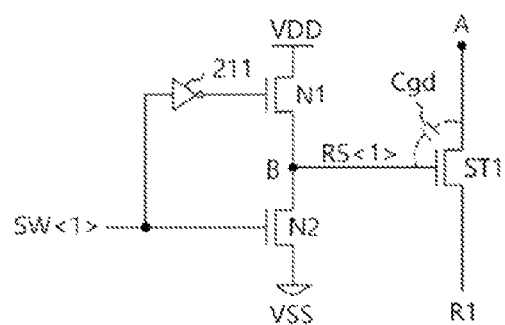
FIG. 5 shows a circuit diagram illustrating coupling relationship between a switch driving unit and a switch transistor, and a timing diagram illustrating an operation of a semiconductor apparatus in accordance with an embodiment of the present invention.
Figure 5:
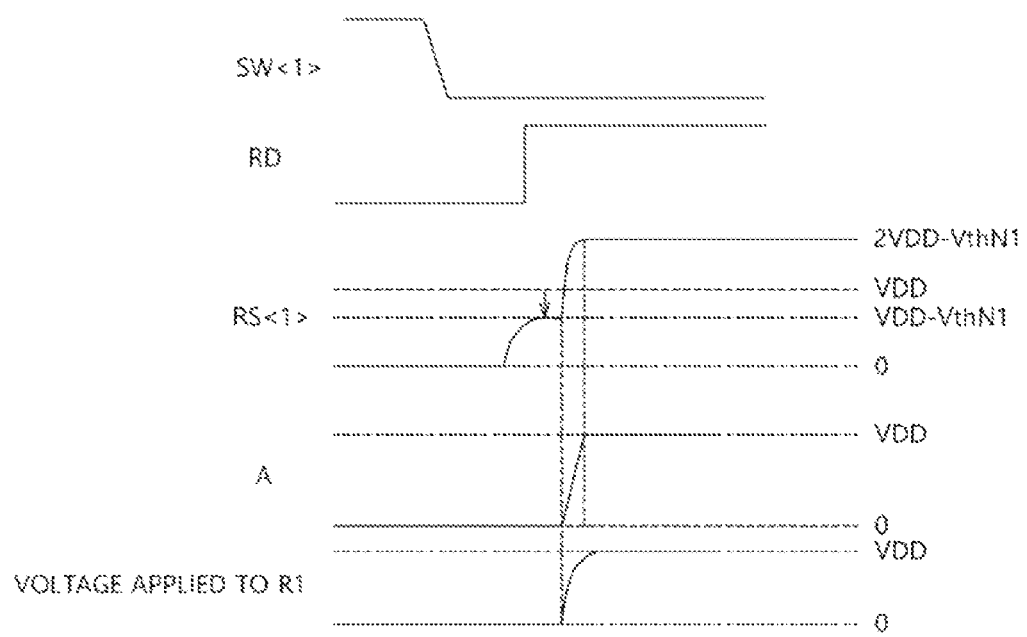

FIG. 5 shows a circuit diagram illustrating a coupling relationship between the first switch driving unit 141 and the first switch transistor ST1, and shows a timing diagram illustrating an operation of the semiconductor apparatus 1 in accordance with an exemplary embodiment of the present disclosure. The operation of the semiconductor apparatus 1 in accordance with an exemplary embodiment of the present disclosure will be described hereinafter.

For example, when the semiconductor apparatus 1 performs read operation for reading the information stored in the first variable resistor R1, the first resistor selection control signal SW<1> may become enabled from a high level to a low level for the semiconductor apparatus 1 to access the first variable resistor R1. In accordance with an exemplary embodiment of the present disclosure, the first resistor selection control signal SW<1> may be firstly enabled and then the read signal RD may be enabled later. The first switch driving unit 141 may enable the first resistor selection signal RS<1> in response to the first resistor selection control signal SW<1>. The enabled first resistor selection signal RS<1> may have the level 'VDD−VthN1' of the second voltage, which is the first voltage VDD minus the threshold voltage VthN1 of the first transistor N1. While the read signal RD is not yet enabled, the drain of the first switch transistor ST1 may have the voltage level corresponding to the ground voltage VSS since the power supply unit 130 does not provide the first voltage VDD to the common node A and the precharge unit 160 drives the common node A to the ground voltage VSS.

After that, the read signal RD may be enabled. When the read signal RD is enabled, the power supply unit 130 may provide the first voltage VDD to the common node A and the drain of the first switch transistor ST1 may have the first voltage VDD. At this time, the voltage level of the first resistor selection signal RS<1> may surge because of a parasitic capacitor Cgd between the gate and drain of the first switch transistor ST1. For example, the first resistor selection signal RS<1> may have the third voltage, and the third voltage may be '2*VDD−VthN1'. When the voltage level of the first resistor selection signal RS<1> surges, the voltage difference Vgs between the gate and source of the first transistor N1 may be lowered under the threshold voltage VthN1 of the first transistor N1. Therefore, the first transistor N1 may be turned off even though the first resistor selection control signal SW<1> stays enabled.

When the first transistor N1 is turned off, the output node B may float and the first resistor selection signal RS<1> may keep the third voltage '2*VDD−VthN1'. The first switch transistor ST1 may be provided with a sufficiently high gate voltage since the first switch transistor ST1 receives the first resistor selection signal RS<1> having the third voltage '2*VDD−VthN1'. Therefore, the first voltage VDD, which is provided to the common node A by the power supply unit 130, may be transferred to the first variable resistor R1 without loss of the threshold voltage of the first switch transistor ST1.

When the first voltage VDD is transferred to the first variable resistor R1, the amount of current flowing through the common node A may change according to the resistance value of the first variable resistor R1 and the sense amplifier 150 may generate the output signal OUT by sensing the amount of current.

As described above, the first and second switch driving units 141 and 142 may raise the voltage levels of the first and second resistor selection signals RS<1:2>, and thus the loss of the threshold voltages of the first and second switch transistors ST1 and ST2 may be prevented. The first and second variable resistors R1 and R2 may receive the power supply voltage VDD from the power supply unit 130 without loss, therefore the current flowing through the common node A may depend only on the resistance values of the first and second variable resistors R1 and R2 and the information stored in the first and second variable resistors R1 and R2 may be precisely outputted by the sense amplifier 150.

Figure 6:
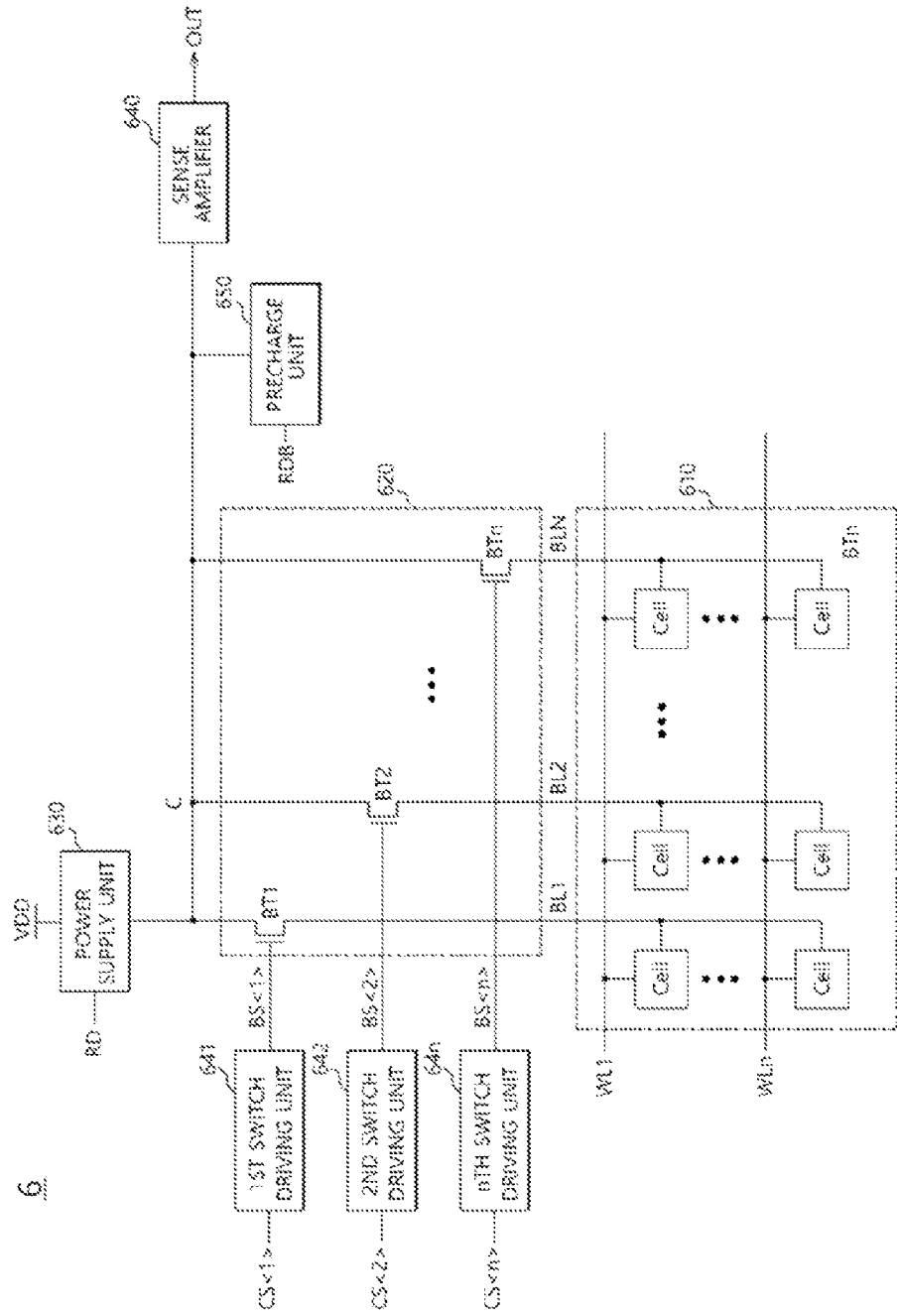
FIG. 6 shows a block diagram illustrating a semiconductor apparatus in accordance with an embodiment of the present invention.

FIG. 6 shows a block diagram illustrating a semiconductor apparatus 6 in accordance with an exemplary embodiment of the present disclosure. The semiconductor apparatus 6 of FIG. 6 may be a memory apparatus for storing and outputting data. Referring to FIG. 6, the semiconductor apparatus 6 may include a memory block 610, a column selection unit 620, a power supply unit 630 and a plurality of switch driving units 641 to 64n.

The memory block 610 may include a plurality of word lines WL1 to WLm, a plurality of bit lines BL1 to BLn, and a plurality of memory cells CELL. The memory block 610 may be an array of the memory cells CELL. The plurality of word lines WL1 to WLm may be disposed in a row direction, and the plurality of bit lines BL1 to BLn may be disposed in a column direction. The plurality of memory cells CELL may be respectively disposed on cross points of the plurality of word lines WL1 to WLm and plurality of bit lines BL1 to BLn. Therefore, a particular memory cell may be accessed by selecting one of the plurality of word lines WL1 to WLm and one of the plurality of bit lines BL1 to BLn, which correspond to the particular memory cell.

The semiconductor apparatus 6 may preferably be a nonvolatile memory apparatus while the semiconductor apparatus 6 may be a volatile memory apparatus. For example, the semiconductor apparatus 6 may be one or a combination of the flash memory apparatus, the resistive random access memory (RRAM) apparatus, the phase-change random access memory (PRAM) apparatus, the ferroelectric random access memory (FRAM) apparatus, the spin transfer torque random access memory (STT-RAM) apparatus, and so forth.

Also, each of the plurality of memory cells CELL may be the flash memory device or the EEPROM memory device. Further, each of the plurality of memory cells CELL may be one of the RRAM device, the PRAM device, the FRAM device, the STT-RAM device, and so forth.

The column selection unit 620 may select one of the plurality of bit lines BL1 to BLn according to bit line selection signals BS<1:n>. The column selection unit 620 may be electrically coupled between the memory block 610 and a common node C, and may be electrically coupled to each of the plurality of memory cells CELL through the plurality of bit lines BL1 to BLn. The column selection unit 620 may include a plurality of switch transistors BT1 to BTn, a number of which corresponds to a number of the plurality of bit lines BL1 to BLn. Each of the plurality of switch transistors BT1 to BTn may receive a corresponding one of the bit line selection signals BS<1:n>.

The power supply unit 630 may provide a first voltage to the common node C in response to a read signal RD. The first voltage may be the power supply voltage VDD. A number of the plurality of switch driving units 641 to 64n may correspond to the number of the plurality of bit lines BL1 to BLn or the plurality of switch transistors BT1 to BTn. The first switch driving unit 641 may be electrically coupled to the first switch transistor BT1 electrically coupled to the first bit line BL1. The second switch driving unit 642 may be electrically coupled to the second switch transistor BT2 electrically coupled to the second bit line BL2. The n-th switch driving unit 64n may be electrically coupled to the n-th switch transistor BTn electrically coupled to the n-th bit line BLn.

Each of the plurality of switch driving units 641 to 64n may be the same as the first switch driving unit 141, which is described above with reference to FIG. 2, except for its input and output signals. The first switch driving unit 641 may generate the first bit line selection signal BS<1> in response to a first column selection signal CS<1>. The second switch driving unit 642 may generate the second bit line selection signal BS<2> in response to a second column selection signal CS<2>. The n-th switch driving unit 64n may generate the n-th bit line selection signal BS<n> in response to a n-th column selection signal CS<n>. The column selection signals CS<1:n> may be generated on the basis of a column address signal, and may be enabled for selecting one of the plurality of bit lines BL1 to BLn electrically coupled to one of the plurality of memory cells CELL, which is to be accessed. The plurality of switch driving units 641 to 64n may generate the bit line selection signals BS<1:n> having the level of a second voltage when the column selection signals CS<1:n> are enabled, respectively. After that, the plurality of switch driving units 641 to 64n may generate the bit line selection signals BS<1:n> having the level of a third voltage when the read signal RD is enabled and the common node A is provided with the first voltage VDD by the power supply unit 630.

Referring to FIG. 6, the semiconductor apparatus 6 may further include a sense amplifier 650 and a precharge unit 660. When one of the plurality of bit lines BL1 to BLn is selected by the bit line selection signals BS<1:n>, the sense amplifier 650 may generate an output signal OUT by sensing and amplifying information of a memory cell electrically coupled to the selected bit line. The sense amplifier 650 may be electrically coupled to the common node C. The plurality of memory cells CELL may be electrically coupled to the sense amplifier 650 through the plurality of switch transistors BT1 to BTn forming the column selection unit 620. Therefore, the sense amplifier 650 may be electrically coupled to one of the plurality of memory cells CELL through the column selection unit 620, and may generate the output signal OUT by sensing and amplifying the information of the selected memory cell, which is transferred through the plurality of bit lines BL1 to BLn. The sense amplifier 650 may include an analogue to digital converter (ADC) configured to generate a digital signal by sensing current flowing through the common node C, or a voltage amplifier configured to generate a digital signal by comparing voltage levels of the common node C and a reference voltage.

The precharge unit 660 may precharge the common node C in response to an inversed signal RDB of the read signal RD. For example, the precharge unit 660 may precharge the common node C by driving the common node C to the ground voltage VSS when the read signal RD is disabled. The precharge unit 660 may be turned off and release the precharge of the common node C when the read signal RD is enabled.

While certain embodiments have been described above, it will be understood to those skilled in the art that the embodiments described are examples only. Accordingly, the semiconductor apparatus for reading stored information of resistors or cells should not be limited based on the described embodiments. Rather, the semiconductor apparatus for reading stored information of resistors or cells described herein should only be limited in light of the claims that follow when taken in conjunction with the above description and accompanying drawings.

What is claimed is:

1. A semiconductor apparatus comprising:
a variable resistor;
a variable resistor selection unit configured to electrically couple the variable resistor to a sense amplifier in response to a resistor selection signal;
a power supply unit configured to apply a first voltage to the variable resistor selection unit in response to a read signal; and
a switch driving unit configured to generate the resistor selection signal in response to a resistor selection control signal, and to raise a voltage of the resistor selection signal when the first voltage is applied to the variable resistor selection unit.

2. The semiconductor apparatus of claim 1,
wherein the variable resistor selection unit comprises a switch transistor, and
wherein the switch transistor has a gate which receives the resistor selection signal, a drain electrically coupled to the power supply unit, and a source electrically coupled to the variable resistor.

3. The semiconductor apparatus of claim 1,
wherein the variable resistor selection unit comprises a switch transistor, and
wherein the switch transistor comprises an N channel transistor.

4. The semiconductor apparatus of claim 1, wherein the switch driving unit generates the resistor selection signal having a second voltage when the resistor selection control signal is enabled, and generates the resistor selection signal having a third voltage when the first voltage is applied to the variable resistor selection unit.

5. The semiconductor apparatus of claim 4, wherein the third voltage corresponds to a sum of the first and second voltages.

6. The semiconductor apparatus of claim 1, wherein the switch driving unit comprises:
an inverter configured to invert the resistor selection control signal;
a first transistor configured to receive an output of the inverter, and to drive an output node to the first voltage; and
a second transistor configured to drive the output node to a ground voltage in response to the resistor selection control signal,
wherein the resistor selection signal is generated at the output node.

7. The semiconductor apparatus of claim 6, wherein the first and second transistors are N channel transistors.

8. The semiconductor apparatus of claim 1, wherein the resistor selection control signal is enabled prior to the read signal.

9. The semiconductor apparatus of claim 1, further comprising:
a precharge unit configured to precharge a common node in response to the read signal,
wherein the variable resistor selection unit, the power supply unit and the sense amplifier are coupled at the common node.

10. A semiconductor apparatus comprising:
a column selection unit configured to electrically couple a power supply unit to a memory cell through a bit line in response to a bit line selection signal, wherein the power supply unit is configured to apply a first voltage to the column selection unit in response to a read signal; and
a switch driving unit configured to generate the bit line selection signal in response to a column selection signal, and to raise a voltage of the bit line selection signal when the first voltage is applied to the column selection unit.

11. The semiconductor apparatus of claim 10,
wherein the column selection unit comprises a switch transistor, and
wherein the switch transistor has a gate which receives the bit line selection signal, a drain electrically coupled to the power supply unit, and a source electrically coupled to the bit line.

12. The semiconductor apparatus of claim 10,
wherein the column selection unit comprises a switch transistor, and
wherein the switch transistor comprises an N channel transistor.

13. The semiconductor apparatus of claim 10, wherein the switch driving unit generates the bit line selection signal having a second voltage when the column selection control signal is enabled, and generates the bit line selection signal having a third voltage when the first voltage is applied to the column selection unit.

14. The semiconductor apparatus of claim 13, wherein the third voltage corresponds to a sum of the first and second voltages.

15. The semiconductor apparatus of claim 10, wherein the switch driving unit comprises:
an inverter configured to invert the column selection signal;
a first transistor configured to receive an output of the inverter, and to drive an output node to the first voltage; and
a second transistor configured to drive the output node to a ground voltage in response to the column selection signal,
wherein the bit line selection signal is generated at the output node.

16. The semiconductor apparatus of claim 15, wherein the first and second transistors are N channel transistors.

17. The semiconductor apparatus of claim 10, wherein the column selection control signal is enabled prior to the read signal.

18. The semiconductor apparatus of claim 10,
further comprising a sense amplifier electrically coupled to a common node, and configured to sense and amplifying voltage or current of the memory cell,
wherein the power supply unit and the column selection unit are coupled at the common node.

19. The semiconductor apparatus of claim 10,
further comprising a precharge unit configured to precharge a common node in response to the read signal,
wherein the power supply unit and the column selection unit are coupled at the common node.

* * * * *